United States Patent [19]
Pontius et al.

[11] Patent Number: 5,745,431
[45] Date of Patent: Apr. 28, 1998

[54] ADDRESS TRANSITION DETECTOR (ATD) FOR POWER CONSERVATION

[75] Inventors: Dale Edward Pontius, Colchester; Steven William Tomashot, Chittenden County, both of Vt.; Toshiaki Kirihata, Dutchess County, N.Y.; Robert Henry Kruggel, Chittenden County, Vt.

[73] Assignee: International Business Machines Corporation, Armonk, N.Y.

[21] Appl. No.: 583,263

[22] Filed: Jan. 5, 1996

[51] Int. Cl.⁶ .................................................. G11C 8/00
[52] U.S. Cl. ........................ 365/233.5; 365/189.05; 365/230.08
[58] Field of Search ............ 365/233.5, 230.08, 365/189.05

[56] References Cited

U.S. PATENT DOCUMENTS

| | | |
|---|---|---|
| 4,573,147 | 2/1986 | Aoyama et al. ............... 365/233.5 |
| 4,656,610 | 4/1987 | Yoshida et al. ............... 365/200 |
| 4,937,830 | 6/1990 | Kawashima et al. ........... 371/40.1 |
| 5,062,082 | 10/1991 | Choi ............................ 365/230.06 |
| 5,160,861 | 11/1992 | Lee .............................. 365/206 |
| 5,214,609 | 5/1993 | Kato et al. ................... 365/233.5 |
| 5,305,283 | 4/1994 | Shimokura et al. ......... 365/230.08 |
| 5,335,206 | 8/1994 | Kawamoto .................... 365/233.5 |
| 5,548,560 | 8/1996 | Stephens, Jr. et al. ...... 365/233.5 |
| 5,592,435 | 1/1997 | Mills et al. ................... 365/233.5 |

*Primary Examiner*—Son T. Dinh
*Attorney, Agent, or Firm*—Whitham, Curtis, Whitham & McGinn; Howard J. Walter, Jr.

[57] ABSTRACT

An address decode circuit for receiving address input signals, includes a device for detecting a change in the address input signals, and a device for generating a control signal in response to a detected change in the address input signals. A gating mechanism gates at least one address bit in the address input signals input to the address decode circuit with the control signal.

16 Claims, 3 Drawing Sheets

ADDRESS TRANSITION DETECTOR (ATD) FOR POWER CONSERVATION

BACKGROUND OF THE INVENTION

1. Field of the Invention

The present invention generally relates to an address transition detector (ATD), and more particularly to an ATD which conserves power of a memory (e.g., a dynamic random access memory (DRAM)) output circuit by gating at least one bit to an address decode circuit and by resetting a data latch coupled to an off-chip driver (OCD).

2. Description of the Related Art

Generally, a memory includes means (e.g., memory cell groups) for storing data, a selecting means (e.g., a decoder) for selectively storing and/or reading out data into and/or from an addressed memory location, means (e.g., a sense amplifier) for sending the signal state of the input/output data and a means (e.g., a data bus) for passing the data (e.g., a data bus).

Address transition detectors (ATDs) are well-known and are commonly used in such memories as described above. For example, the ATDs are useful in static random access memories (SRAM) and erasable programmable read-only memories (EPROM).

ATDs are useful for increasing the speed with which data can be read from the memory. This is accomplished by performing operations which are required for every memory read operation as soon as an address transition has been detected.

These operations include equalizing sense amplifiers and latching the previous output. The sense amplifiers are for increasing the weak signals sensed from the memory cells to be read during the read operation.

Equalizing the sense amplifiers causes the amplifiers to be cleared or otherwise set up so that they are ready to process the new data to be read.

Latching the previous output causes the output to stay static until the new data read from the read operation has been output from the sense amplifiers. The previous output is latched because the output of the sense amplifiers fluctuates before it finally reaches a steady value. Latching the previous output ensures that the swing does not pass down to the outputs.

Circuitry for equalizing the sense amplifiers and for latching the previous outputs is well-known. Both operations are normally conducted during a memory read operation. The address transition detection circuitry permits these operations to be performed earlier than would be the case if address transition detection (ATD) means was not employed.

ATDs are typically used to operate clocked circuitry from an unclocked external address changes. Because the address transition may be "undisciplined", any clock signal generated using an ATD will have some amount of skew to the final stable address. For purposes of this application, "undisciplined" is defined as there being no way of having knowledge or predicting when any address transition will occur, or even if it will "change its mind" and become just a "glitch".

While some compensation (e.g., "fat") may be added to alleviate the skew, this compensation must be balanced against address access loss and thus remains a "critical timing". For purposes of this application, a "critical timing" is defined as a timing which will have a direct effect on the net performance of the part. A "non-critical timing" may be, for example, a signal path that has plenty of margin and is waiting on another signal path (which is the "critical timing" in this case) or control some other aspect which does not directly affect performance.

Conventional ATDs have used an analog sensing scheme to implement standard fast-page mode. For purposes of this application, "fast-page mode" is defined as when data access is being continually performed so long as the row address strobe (RAS) is low and column address strobe (CAS) is high. This term does not mean "continuous", so much as the circuits are constantly trying to guarantee that internally accessed data reflects the address present at the pad. In this case, CAS serves as output control and freezes the address inputs.

However, while this operation is reliable and free of critical timings, excessive power is consumed. For example, power on the order of about 1 mA per internally accessed data is consumed. In an X4 part this may typically be 4 mA. However, it is often common to access multiple bits per input/output (I/O) operation, in which case this number in practice may be 8 mA or 16 mA in practical designs.

Referring to FIG. 3, an exemplary conventional system is shown in which a column address generator 31 is connected to a column decoder 32. The output of the column decoder 32 is connected to an N-channel, field-effect transistor (NFET) bit switch pair 33. The bit switch pair 33 couples a pair of complementary pair of bit lines 34a, 34b to a complementary set of data lines 35a, 35b.

P-channel FET devices 36a, 36b are connected to the data lines and are always turned on during read operations. There is a carefully tuned device strength ratio between the PFET data line pullups, the NFET bit switch pair 33 and the latch devices of the primary sense amplifier 37.

In this regard, a continuous current flows through one PFET data line pull-up, its matching NFET of the bit switch pair, and the NFET on the "low" side of the primary sense amplifier 37. There is no current flowing in the matching devices on the "high" side of the primary sense amplifier 37. A continuous current also flows through the PFET data line pullups into the amplifier circuit 37.

This ratio, in conjunction with the "0" or "1" present in the primary sense amplifier, produces a few hundred millivolts of drop in one of the data lines 35a, 35b that can be interpreted as a differential signal between the data lines 35a, 35b. This differential signal is amplified by amplifier 37 and coupled to the off-chip drivers (OCDs) 38. As mentioned above, excessive power is consumed by such a design.

Moreover, while the conventional SRAM/DRAM designs use dynamic data-line precharge circuits, differential amplifiers, dummy data-line interlocks, data-line signal self-timed receiver/amplifiers, and data-line signal gated tri-state control of OCDs, the problems above still occur.

Specifically, while there are no critical timings in the above architecture, power is unduly consumed. Moreover, while the use of an ATD has been known to gate data and to turn off amplifiers as part of power conservation schemes in general, power is still unduly and unacceptably consumed.

Yet another problem is that the conventional systems are also subject to "early access", in which if the address changes just prior to a CAS fall, the data from the previous address may be presented by the OCDs before the correct data is available. Then, the OCD may change from one data state to another, "burning" (e.g., needlessly consuming) power and causing excessive noise.

SUMMARY OF THE INVENTION

In view of the foregoing problems of the conventional systems, it is therefore an object of the present invention to provide a circuit which reduces power consumption and more specifically to provide an address transition detector (ATD) for reducing power consumption.

Yet another object is to provide an ATD design which reduces power, improves timing control of data line differential amplifiers, and in which there are no critical timings in the architecture thereof.

In a first aspect of the invention, an address decode circuit is provided for receiving address input signals, which includes a mechanism for detecting a change in the address input signals, a mechanism for generating a control signal in response to a detected change in the address input signals, and a mechanism for gating at least one address bit in the address input signals input to the address decode circuit with the control signal.

In another aspect of the invention, a control circuit for an off-chip driver, is provided which includes a data latch having a reset input, coupled to the off-chip driver, an address transition detection circuit, coupled to the data latch, for producing an output signal, and a mechanism for coupling the output signal of the address transition detection circuit with the reset input of the data latch.

With the inventive structure, a system design is provided for reducing power consumption of a differential DRAM output circuit using an address transition detector (ATD) to control the output circuit amplifier, to thereby reduce the power consumption thereof, as compared to the conventional design. A feature of the present invention is that a column address ATD sum pulse and a bit-switch interlock signal are used to gate a data-line differential sense amplifier for interlocked timing and for reducing power dissipation. The control timing signal derived from the previous pulses are used to perform data-line signal interlock, self-timed differential-amplifier output and tri-state control of off-chip drivers (OCDs). Moreover, at least one bit is gated to an address decode circuit and the ATD resets the data latch coupled to the OCD.

Another advantage of the present invention is that the first data delivered to the OCD is the correct data.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
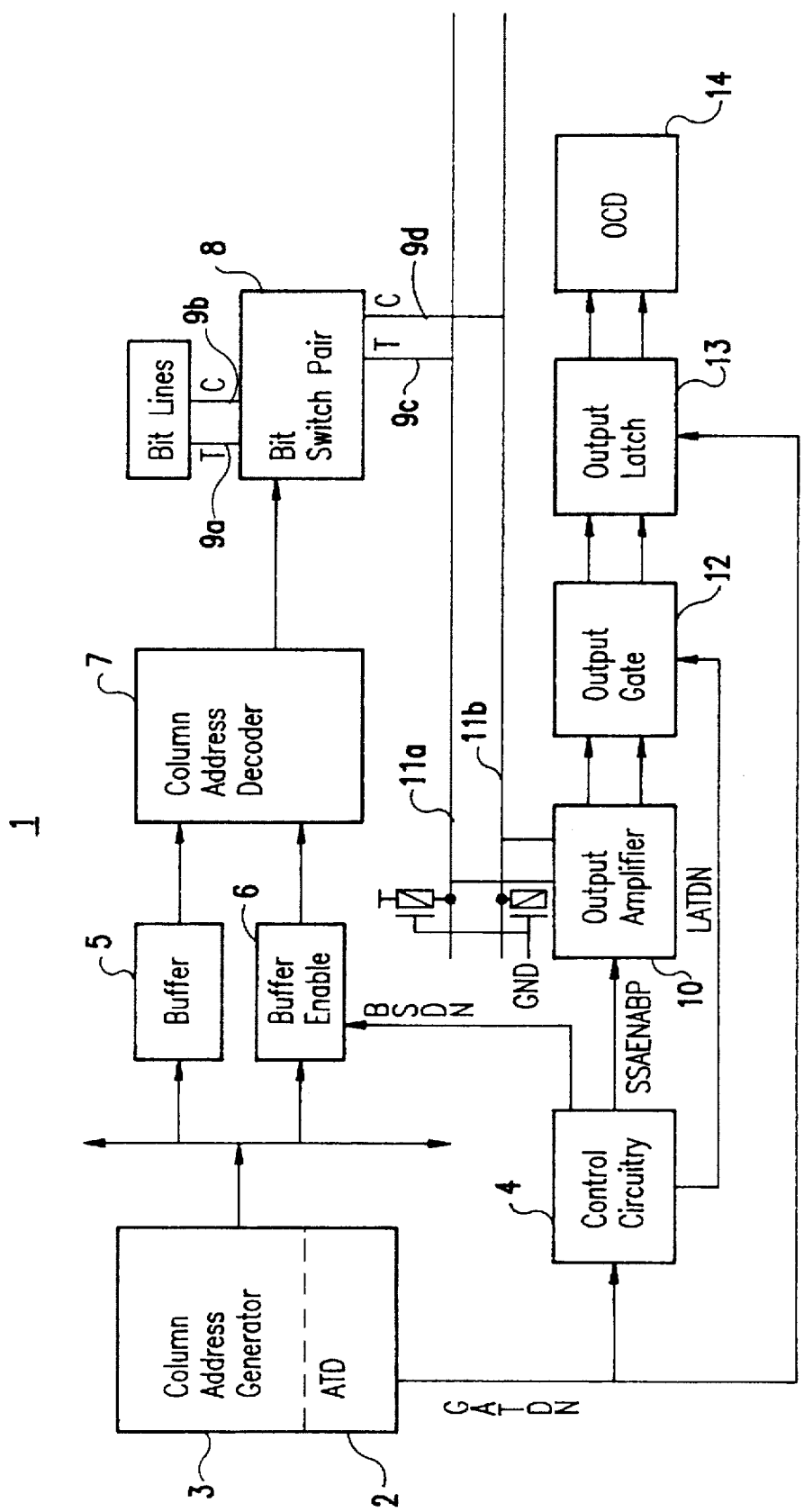
FIG. 1 is a block diagram of an address decode circuit according to the present invention.

Referring now to the drawings, and more particularly to FIG. 1, there is shown a circuit according to a first embodiment of the present invention.

More specifically, FIG. 1 illustrates a system design for reducing power consumption of a differential dynamic random access memory (DRAM) output circuit using an address transition detector (ATD) 2 to control an output circuit amplifier 10. Such a design reduces power consumption as compared to the conventional design.

Briefly, in the invention, a column address ATD sum pulse and bit-switch interlock signal are used to gate the data-line differential sense amplifier for interlocked timing and for reducing power dissipation. The control timing signal derived from the previous pulses are used to perform data-line signal interlock, self-timed differential output amplification and tri-state control of the OCDs. Thus, the inventive system for differential data output of a DRAM device utilizes a column address generator and column address decode functions with a differential output amplifier using the ATD, to control the amplifier power cycle and latch the differential output.

As shown in FIG. 1, a system 1 for reducing power consumption of a memory (e.g., differential DRAM) output circuit, is provided according to the present invention, which includes an address transition detector (ATD) 2 to control an output circuit amplifier 10.

Figure 3:
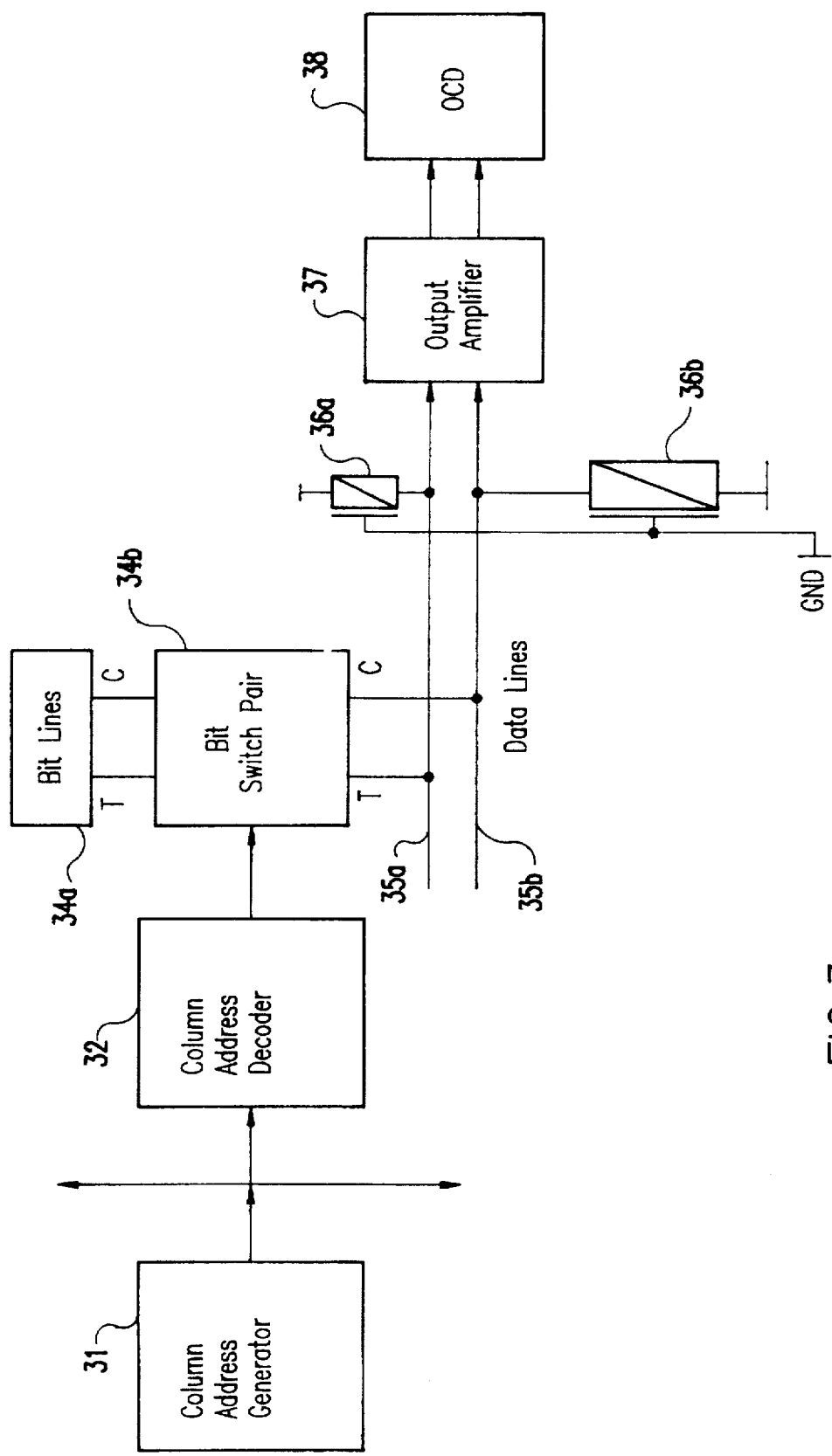
FIG. 3 is block diagram of a conventional address decode circuit.

The system modifies the conventional generation page mode sensing scheme (e.g., shown in FIG. 3), to reduce power while retaining the timing-independent characteristic thereof.

In the inventive circuit, the ATD circuit 2 is used in combination with a column address generation circuit 3. The construction of the ATD 2 and the column address generation circuit are believed to be known in the art and for brevity such will not be described in detail hereinbelow.

Based upon an input of address signals to the column address generator 3, the ATD detects an address transition. Upon such a detection, the ATD 2 issues an output to control circuitry 4. The structure of control circuitry 4 is believed to be known by one ordinarily skilled in the art and for brevity such will not be described in detail hereinbelow.

As discussed in further detail below, control circuitry 4 functions to pass a Global Address Transition Detect Not (GATDN) signal to a Local Address Transition Detect Not (LATDN) signal. Circuitry 4 also generates "first" LATDN without GATDN after the primary sense amplifier sets, and generates a stretched Second Sense Enable Plus (SSAENABP) signal and a Bit Switch Delayed Not (BSDN) signal from the LATDN signal. Finally, circuitry 4 also disables a second sensing system for "write" operations.

The column address generator 3 issues an output to a buffer 5 and to a buffer enable circuit 6. The buffer enable circuit 6 also receives an output BSDN from the control circuitry 4. Preferably, the buffer 5 is formed of a gated buffer (e.g., including NANDs and inverters) which drives only the column addresses in selected array segments. It is noted that driving column addresses in non-selected array segments unnecessarily consumes power.

The buffer enable circuit 6 has a structure similar to that of buffer 5, but includes an additional input BSDN signal so that addresses will not be driven in the selected array segment except when the BSDN signal allows it. Most of the second sensing power is burned (e.g., consumed) between the data line load devices, the bit switch pair, and the primary sense amplifier. By turning off buffer 6 with the BSDN signal, such a power consumption is stopped.

The buffer 5 and buffer enable circuit 6 issue outputs to a column address decoder 7 which in turn issues an output to a bit switch pair 8 coupled to bit lines 9a, 9b. The column address decoder 7 and bit switch pair 8 are similar to those used in the conventional system shown for example, in FIG. 3 and thus, for brevity, will not be described in detail hereinbelow.

Control circuit 4 also issues an output Second Sense Enable Plus (SSENABP) signal to an output amplifier 10, coupled to data lines 11a, 11b. Data lines 11a, 11b are coupled to bit switch pair 8 via bit lines 9c, 9d, respectively, and have precharge devices (unreferenced) attached thereto. The precharge devices may be properly sized PFETs or the like.

The output amplifier 10 issues an output to an output gate 12. Preferably, the output gate 12 has a structure including a gated or tristate buffer. For example, in one implementation, the invention may have two output gates 12 to feed to each output latch 13. Thus, a tristate buffer can be used, although in other data path architectures a gated buffer may be used.

Output gate 12, which is controlled by an output LATDN signal from the control circuitry 4, issues an output to an output latch 13. The output latch 13 may be a R-S flip-flop, a pair of coupled latches having three states (e.g., "off", "true out" and "one out") or the like. This structure allows the OCD to be kept in tristate until the correct data is accessed.

The output latch 13, which is likewise selectively controlled by the control circuitry 4 through an output GATDN signal, in turn issues an output to the off-chip drivers (OCD).

Thus, in the structure of the invention, an address transition detector 2 is added to a column address generation circuit(s). Further, one set of column addresses is normally turned off, thereby turning off a column decoder 7 and bit switch pair 8. The amplifier circuitry 10 for amplifying the data line signal is normally turned off.

Further, in the invention, output gating and latching circuitry (e.g., output gate 12 and output latch 13) has been added after the amplifier circuit 10 and before the off-chip drivers 14.

Moreover, there is additional circuitry provided for using the ATD signal to generate several control signals for the circuits mentioned above. Further, a unique advantage of the present invention is that because the bit switch pair 8 and the output amplifier 10 are both selectively turned off, there is no continuous current consumed with the inventive design.

Figure 2:
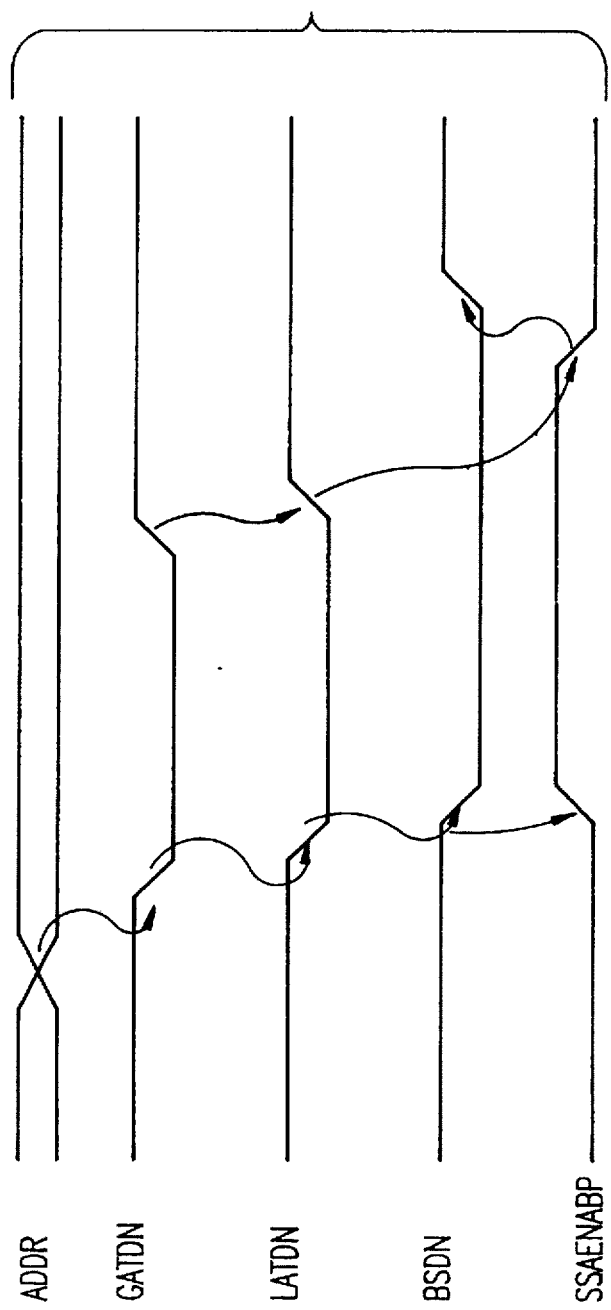
FIG. 2 is a waveform timing diagram illustrating different signals at different output terminals of the inventive circuit according to the present invention as illustrated in FIG. 1.

With reference to FIGS. 1 and 2, a normal operation of the inventive strucutre is described below, with the assumption that a time exists long after a row address strobe (RAS) falls with stable addresses. The special case of time near RAS fall will be considered later.

The signals of interest and their functions are as follows:
GATDN: Global Address Transition Detect Not (active low); master ATD signal on the chip.
LATDN: Local Address Transition Detect Not (active low); Local ATD signal in each array segment, "does the work".
SSAENABP: Second Sense Enable Plus (active high); enables the second sense amplifier.
BSDN: Bit Switch Delayed Not (active low); enables the final column address bits, which enables the bit switches to open.

First, a column address input changes causing a falling edge of the GATDN signal. The GATDN signal is a signal representing changed or changing column addresses, and the need to access new data.

In response to the falling edge of the GATDN, the control circuit 4 generates signals BSDN, SSAENABP, and LATDN.

Specifically, the signal BSDN issued by control circuitry 4 to the buffer enable 6 turns on the unpowered set of column addresses, thereby enabling the column decoder 7 and the bit switch pair 8 to thereby become open.

Signal SSAENABP output by the control circuitry 4 to the output amplifier 10 turns on the output amplifier 10, but LATDN (issued by control circuitry 4 to the output gate 12) gates off its output.

GATDN (or a derived signal), issued to the output latch 13, resets the output latch 13.

With the bit switch 8 open, a differential signal begins to develop on the data lines 11a, 11b. The differential signal is converted to a logic level (e.g., a "0" (low) or a "1" (high)) by the output amplifier 10 and output to the output gate 12, and the output amplifier 10 tracks whatever data is being generated by the currently selected cell.

So long, as the LATDN signal remains low, the converted differential signal is not conveyed to the output latch 13 from the amplifier 10 via the gate 12. Thus, the low LATDN signal prevents data from being passed to the off-chip drivers 14.

After a suitable interval (e.g., generally about 5–8 nS, but of course such can be set according to the designer's requirements and constraints), the GATDN signal rises, which may normally be used to indicate an "address valid" condition. However, if there is an address skew or multiple transitions, GATDN will remain low until the addresses settle (e.g., become stable).

When the addresses have been stable for a "sufficient time" (e.g., approximately 5–8 nS) as determined by the designer's requirements and system characteristics, the GATDN signal will rise, as shown in FIG. 2.

Generally, the addresses must be stable for about 2–3 nS, then an additional 3–5 nS are added before GATDN rises to allow data access to proceed further. For example, the "sufficient time" may be approximately equal to the internal access. The output path may be enabled prior to valid data. In this case, the chip will remain in tristate until sensing has occurred and data is valid. In this mode, data access, not GATDN, is the factor limiting access.

When the GATDN signal rises, the control circuitry 4 responds as discussed below. For example, when GATDN rises, the output latch 13 becomes ready to accept data from the output gate 12.

Shortly after GATDN rises, LATDN rises allowing the sensed data from the output amplifier 10 into the output latch 13 via output gate 12. The data is then free to activate the OCD 14.

Thereafter, there is a "conservative" delay until BSDN and SSAENABP turn off. For purposes of this application, "conservative" is defined as sufficient time for a "slow" bitline/primary sense amplifier combination to develop data through the data lines and secondary sense amplifier. During this time, the output amplifier 10 is free to "change its mind" (e.g., whether to release data or not release data) about the output data and the latch 13 and OCD 14 will follow suit.

Output SSAENABP turns off the output amplifier 10, leaving the data stored in the output latch 13. One portion of the current consumption of the conventional design is now turned off.

Output BSDN turns off one set of the column addresses, turning off the column decoder 7 and the bit switch pair 8, which in turn turns off the other portion of current consumption of the conventional design. Thus, with the unique structure of the present invention, power consumption is decreased and power conservation results.

Typically, the power conservation between the inventive design and the conventional design may be, for example, on the order of 50%. Specifically, the invention reduces the duty cycle, and therefore the power, by about 50% during aggressively timed cycles. With more relaxed timings, the savings increase.

It is noted that GATDN rises after "approximately" the internal access time. However, this delay is subjected to both minimum and maximum constraints. The minimum width is the time it takes the address to get to the bit switch pair 8 and sufficient time to "erase" any signal that may already be present. There is no maximum time, although any amount past that to deliver correct data is an access impact. A preferred time would be slightly less than maximum, such that the GATDN low time grants maximum noise protection while not affecting access.

If the delay is too short, such as less than 3–5 nS, then invalid data may be shipped to the OCD 14 first and then corrected. While correct data is eventually established, both power and time are required to reverse the invalid data. If the delay is too long, then the access time is degraded because the data is not shipped to the OCD 14.

Regardless, the correct data "eventually" appears at the OCD 14, the best power and performance are achieved when the delay is matched to the internal access time, e.g., such as 5–8 nS. This is a difficult target, as different parts of the chip have different internal access times. For example, address speed can be a function of address input levels. Second sensing amplifier speed is usually highly dependent on diffusion capacitance and signal characteristics of the primary sense amplifier. OCD performance is largely dependent on loading. All are dependent on process variation of device characteristics.

However, the invention optimizes such a matching of the internal access times to the delay. Because of this, the approximate nature of the delay requirement yields good power, performance and robustness.

Two other delays are also of interest, concerned mainly with turning off the output amplifier 10 and column address generator 3 and decoder 7. These circuits must be powered long enough to allow the worst possible data access to set the output latch 13. A weak bitline/primary sense amplifier combination may deliver data more slowly than a normal one, so that the second sensing amplifier output will take longer.

Furthermore, the output amplifier must be powered off first, as it may produce an erratic output if the output amplifier were to be active when the column address generator 3 (and column addresses) and decoder 7 were powered off. If this delay is too long, data integrity may not be compromised, but some power may be unduly consumed and thereby wasted.

The description above relates to times "long" (e.g., such as greater than or equal to 25 nS) after RAS has fallen. A few additions are required to cover conditions during a RAS restore and "shortly" (e.g., such as 15 nS) after a RAS fall.

First, the entire system must be guaranteed to be shut off and precharged during RAS store. This is relatively simple using existing signals.

The column addresses and decoder must not be powered up until primary sensing is complete. This can be accomplished, for example, by gating the powering up signal in the output gate 12 with a "bit switch interlock" signal commonly found in dynamic random access memories (DRAMs). This feature and the release of the powering up signal are discussed briefly below.

Specifically, during bitline signal development and primary sensing no external sources may be allowed to affect the bitline. The bit switch interlock prevents premature second sensing from disturbing the primary sensing operation. When the primary sense amplifier is sufficiently set, second sensing may occur.

A "dummy" address transition is required to cover those timings where either the row and column addresses are the same, thereby producing no regular ATD signal, or where the transition between row and column addresses is so early that the ATD signal produced is masked by the bit switch interlock signal mentioned above. This extra address transition can be generated from the bit switch interlock signal itself.

The above-described system guarantees that everything resets during RAS restore, while DRAMs have the ability to hold data out while CAS is low after RAS has risen. This can be accomplished by either an additional output latch, keeping data at the OCD under those conditions, or by modifying the timing of the existing latch so it is not reset until RAS and column address strobe (CAS) are both high.

Further, as described briefly above and as compared to the conventional design, oftentimes the ATD is used to clock a dynamic latch. In such a case, the timing of the ATD must be exact. If it is too short, incorrect data may be latched and delivered to the OCDs, and in the conventional design it will not eventually correct itself as in the structure of the present invention. Conversely, if the ATD pulse is too long, access will be delayed with the present invention.

With the structure of the present invention, a system design is provided for reducing power consumption of a different DRAM output circuit using an address transition detector (ATD) to control the output circuit amplifier, to thereby reduce the power consumption as compared to the conventional design. At least one bit is gated to an address decode circuit and the ATD resets the data latch coupled to the off chip driver (OCD).

Moreover, a column address ATD sum pulse and a bit switch are preferably used for interlocking an output latch and signals derived from the ATD through a control circuit, are used for the output, turn the amplifier on or off, and gate the buffer enable.

Thus, with the invention, an address transition detector (ATD) is provided for reducing power consumption, and in which improved timing control of data-line differential sense amplifiers, and in which there are no critical timings in the architecture thereof. Power conservation also occurs in the column address decoder via buffer enable control and in the off chip driver circuits (OCDs) via a data output latch.

Moreover, control timing signals derived from the previous pulses are used to perform data-line signal interlock, self-timed differential amplifier output and tri-state control of the OCDs.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An address decoding circuit for decoding an address signal having a power saving feature, comprising:
   means for passing a partial address signal to the address decoding circuit;
   means for detecting a change in said address signal;
   means for generating a first control signal in response to a detected change in the address signal; and
   means for gating a remainder of said address signal to the decoding circuit with the first control signal, said decoding circuit being in a power conservation state until receiving said remainder of said address signal.

2. A circuit according to claim 1, wherein said means for detecting comprises an address transition detection circuit coupled to said means for generating for providing thereto said change in address, and said partial address signal comprises at least one bit of said address signal.

3. A circuit according to claim 2, further comprising a column address generator for generating said address signal and wherein said means for gating comprises a buffer enable circuit coupled to said means for generating.

4. A circuit according to claim 3, further comprising:
a bit switch pair activated in response to said decoding circuit;
an output amplifier coupled to said means for generating for amplifying said bit switch pair, said output amplifier receiving a second control signal for turning on said output amplifier in response to said address the detected change in the address signal; and a logic gate for receiving an output of said output amplifier and, said logic gate activated in response to a third control signal from said means for generating.

5. A circuit according to claim 1, wherein
said means for passing comprises an address generator for receiving said address signals,
said means for gating comprises a buffer enable circuit coupled to said means for passing, said decoding circuit further comprising:
an address decoder coupled to said buffer enable circuit;
a bit switch pair having an input thereof coupled to said address decoder; and
an output amplifier coupled to an output of said bit switch pair,
wherein said buffer enable circuit is enabled upon receipt of said first control signal from said means for generating, to thereby enable said address decoder and said bit switch pair.

6. A circuit according to claim 1, further comprising:
an output amplifier, coupled to said means for generating, for receiving a second control signal therefrom, and a data latch coupled to said means for detecting; and
an output gate coupled to said output amplifier;
wherein said said output gate passes an output of said output amplifier in accordance with a third control signal from said means for generating.

7. A circuit according to claim 1, further comprising:
an output amplifier coupled to said means for generating;
an address decoder operatively coupled to said means for gating; and
a bit switch pair coupled to said address decoder,
wherein said output amplifier and said bit switch pair are selectively powered by said means for generating such that substantially no continuous current is consumed by said output amplifier and said bit switch pair.

8. A circuit according to claim 1, further comprising:
an output amplifier coupled to said means for generating; and
a bit switch pair coupled to said output amplifier,
wherein said output amplifier and said bit switch pair are selectively actuated by said means for generating such that current is consumed by said output amplifier and said bit switch pair substantially only when said output amplifier and said bit switch pair are actuated.

9. A control circuit for an off-chip driver, comprising:
a data latch having a reset input, coupled to said off-chip driver;
a transition detection circuit, coupled to said data latch, for producing an output signal; and
means for coupling the output signal of the transition detection circuit with the reset input of the data latch, wherein said control circuit is in a power conservation state until said transition detection circuit detects a change in an input signal.

10. A circuit according to claim 9, wherein said transition detection circuit comprises an address transition detection circuit, further comprising:

an output amplifier for receiving data and for producing an output; and
an output gate for receiving said output of said amplifier and for providing an input to said data latch, wherein said output amplifier is turned to an on state by a detected change in an input address signal and said output gate is turned on after said output amplifier is turned on.

11. A system for reducing power consumption of a memory output circuit coupled to an off-chip driver, comprising:
means for detecting a change in input signals input to said system and for providing an output;
a controller, coupled to said means for detecting, for generating a plurality of control signals, a first control signal being generated in response to a detected change in the input signals;
means for gating at least one bit of the input signals input to the system with said first control signal;
an amplifier for amplifying memory bit lines connected to said controller, wherein said amplifier consumes substantially no power until activated by said controller; and
a data latch, gated to said amplifier, for providing an amplified bit signal said off chip driver.

12. A system according to claim 11, wherein said means for detecting comprises an address transition detection circuit coupled to said controller for providing thereto said change in said input signals.

13. A system according to claim 12, further comprising an address generator for receiving input signals comprising address input signals, and said means for gating comprises a buffer enable circuit for receiving an input from said address generator and said controller.

14. A system according to claim 13, wherein said buffer enable circuit passes at least one bit of said address input signals upon receipt of said first control signal from said controller.

15. A system according to claim 11, further comprising:
an output gate connected to said means for detecting; and
an output amplifier coupled to said controller and said output gate for receiving a second control signal from said controller,
wherein said output gate passes an output from said output amplifier to said data latch upon receipt of a third control signal from said controller.

16. A system according to claim 11, wherein said means for gating comprises a buffer enable circuit, said system further comprising:
an address generator for receiving said input signals, said input signals comprising address input signals;
an address decoder coupled to said buffer enable circuit;
a bit switch pair having an input thereof coupled to said address decoder; and
an output amplifier coupled to an output of said bit switch pair,
wherein said buffer enable circuit is enabled upon receipt of said first control signal from said controller, to thereby enable said address decoder and said bit switch pair,
wherein said output amplifier and said bit switch pair are selectively actuated by said controller such that current is consumed by said output amplifier and said bit switch pair substantially only when said output amplifier and said bit switch pair are actuated.

* * * * *